United States Patent
Jhon et al.

(10) Patent No.: US 9,716,047 B2
(45) Date of Patent: Jul. 25, 2017

(54) METHOD OF MEASURING A SUBSTRATE AND METHOD OF MANUFACTURING A SEMICONDUCTOR DEVICE USING THE SAME

(71) Applicant: Samsung Electronics Co., Ltd., Suwon-si (KR)

(72) Inventors: Chol-Min Jhon, Seoul (KR); Seok Park, Seoul (KR); Ho-Hyung Jung, Hwaseong-si (KR); Yang-Kyu Kim, Hwaseong-si (KR); Jae-Young Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/218,026

(22) Filed: Jul. 24, 2016

(65) Prior Publication Data
US 2017/0103925 A1    Apr. 13, 2017

(51) Int. Cl.
*H01L 21/66* (2006.01)
*G01B 11/00* (2006.01)
*G01B 11/06* (2006.01)
*H01L 21/78* (2006.01)
*H01L 21/52* (2006.01)

(52) U.S. Cl.
CPC ............ *H01L 22/20* (2013.01); *G01B 11/002* (2013.01); *G01B 11/0616* (2013.01); *H01L 21/52* (2013.01); *H01L 21/78* (2013.01); *H01L 22/12* (2013.01)

(58) Field of Classification Search
CPC ....... H01L 22/20; H01L 21/78; G01B 11/002; G01B 11/02; G01B 21/52; G01B 22/12; G01B 21/78; G01B 11/0616
See application file for complete search history.

(56) References Cited

U.S. PATENT DOCUMENTS

| | | | |
|---|---|---|---|
| 7,477,396 B2 * | 1/2009 | Smith | G03F 7/70633 356/445 |
| 8,538,168 B2 * | 9/2013 | Liu | G06K 9/6203 356/124 |
| 8,750,597 B2 | 6/2014 | Patterson et al. | |
| 2014/0136137 A1 | 5/2014 | Tarshish-shapir et al. | |
| 2015/0116686 A1 | 4/2015 | Lee et al. | |
| 2015/0125069 A1 | 5/2015 | Zhou | |

FOREIGN PATENT DOCUMENTS

| | | |
|---|---|---|
| JP | 2002-313887 | 10/2002 |
| JP | 2008-177342 | 7/2008 |
| JP | 2010-177691 | 12/2010 |
| KR | 10-2004-0051863 | 6/2004 |
| KR | 10-2007-0053831 | 5/2007 |
| KR | 10-2007-0077260 | 7/2007 |
| KR | 10-2010-0071659 | 6/2010 |

* cited by examiner

*Primary Examiner* — Yasser A Abdelaziez
(74) *Attorney, Agent, or Firm* — Muir Patent Law, PLLC

(57) ABSTRACT

A method for measuring a substrate is provided. The method comprises irradiating a measurement beam into a site box of an identifiable pattern of a substrate, detecting a center position of the irradiated measurement beam, calculating an amount of shift of the center position of the measurement beam from the center position of the site box, and correcting the center position of the measurement beam to the center position of the site box by compensating the calculated amount of shift.

20 Claims, 6 Drawing Sheets

METHOD OF MEASURING A SUBSTRATE AND METHOD OF MANUFACTURING A SEMICONDUCTOR DEVICE USING THE SAME

This application claims priority under 35 U.S.C. §119 to Korean Patent Application No. 10-2015-0140747 filed on Oct. 7, 2015 in the Korean Intellectual Property Office, the disclosure of which is incorporated herein by reference in its entirety.

BACKGROUND

1. Technical Field

The disclosed embodiments relate to a method of measuring a substrate and a method of manufacturing a semiconductor device. For example, the embodiments relate to a method of measuring a thickness of a thin film or a pattern on a substrate.

2. Description of the Related Art

In general, manufacturing processes of a semiconductor device include processes of forming various thin films such as an insulating film, a dielectric film, and a metal film on a substrate formed of a wafer of a monocrystalline silicon material, and processes patterning the various thin films.

Recently, with high integration of semiconductor devices, the number of thin films formed on a substrate has increased, and influences of the physical properties of the thin films on the subsequent processes and on the final device has been further increased.

Thus, after forming the thin film, it is beneficial to evaluate physical characteristics of the thin films and to use the evaluation result for subsequent processes. Various evaluation processes may be executed according to respective physical characteristics of the thin film.

Among the physical properties of the thin film, the thickness of the thin film has a significant influence on the quality of the semiconductor device. For example, when a desired thickness is not achieved in a cell block, it may cause a decrease in the quality of the semiconductor device which may lead to a decrease in yield.

Thus, to measure the uniformity of the thickness of a thin film on a wafer, an apparatus that measures the thickness of the thin film at a plurality of points on the wafer has been disclosed. However, as the semiconductor devices become smaller and smaller, the area to measure a thickness are being further reduced, which may affect the accuracy of the thickness measurement.

As the design rule of semiconductor devices is getting finer, a minute deviation from a target measuring location may cause a measurement error, and this measurement error may lead to an incorrect determination of a thin film thickness on the substrate.

SUMMARY

Aspects of the present inventive concept provide a method of measuring a substrate with improved reliability.

Aspects of the present inventive concept provide a method of measuring a substrate in which an accuracy of the thickness measurement of the thin film or pattern formed on the substrate is improved.

Aspects of the present inventive concept provide a method of measuring a substrate capable of correcting the measuring position for improvement of the substrate measurement accuracy.

Aspects of the disclosure provide methods of manufacturing semiconductor devices using improved thickness measurement method.

According to an aspect of the present inventive concept, there is provided, a method of manufacturing a semiconductor device comprises steps of providing a substrate on a stage of a measuring apparatus, irradiating a measurement beam into an identifiable pattern of the substrate, detecting a center position of the irradiated measurement beam, detecting a center position of the identifiable pattern, calculating an amount of shift of the center position of the measurement beam from the center position of the identifiable pattern, and moving the center position of the measurement beam to the center position of the identifiable pattern in response to the calculated amount of shift.

The identifiable pattern may be a conductive pad of the semiconductor device. The identifiable pattern may be a metal layer of a memory cell block of the semiconductor device. The calculation of the amount of shift of the center position of the measurement beam may comprise using two-dimensional coordinates of the center position of the measurement beam in the identifiable pattern. The method may further comprise a step of measuring a thickness of a layer formed on the identifiable pattern using the measurement beam, after the moving the center position of the measurement beam to the center position of the identifiable pattern. The moving the center position of the measurement beam to the center position of the identifiable pattern may comprise a step of moving the substrate. The moving the center position of the measurement beam to the center position of the identifiable pattern may comprise a step of moving the substrate so that the amount of shift of the center position becomes zero. The moving the center position of the measurement beam may comprise a step of detecting a plurality of center positions. At least one of the plurality of center positions may be adjacent to an edge of the substrate.

According to an aspect of the present inventive concept, there is provided, a method of manufacturing a semiconductor device comprises steps of irradiating a measurement beam into a chip region of a substrate, detecting a center position of the measurement beam after irradiating the measurement beam, extracting a site box representing edges of an identifiable pattern of the semiconductor device from the chip region irradiated with the measurement beam, calculating an amount of shift of the center position of the measurement beam from a center position of the site box, and adjusting the center position of the measurement beam to correspond to the center position of the site box in response to the calculated amount of shift.

The site box may be determined from an image extracted from the identifiable pattern in the chip region. The identifiable pattern may comprise a patterned metal having a rectangular surface area. The calculating the amount of shift of the center position of the measurement beam from the center position of the site box may comprise using two-dimensional coordinates of the center position of the measurement beam in the site box. The method may further comprise a step of measuring a thickness of a layer formed on the identifiable pattern in the chip region using the measurement beam, after the adjusting the center position of the measurement beam to the center position of the site box. The adjusting the center position of the measurement beam to the center position of the site box may comprise a step of moving the substrate.

According to an aspect of the present inventive concept, there is provided, a method of manufacturing a semiconductor device comprises steps of forming an identifiable pattern with a thin film layer on a substrate, providing the substrate on a stage of a measuring apparatus, irradiating a measurement beam on the identifiable pattern of the substrate, detecting a center position of the irradiated measurement beam, detecting a center position of the identifiable pattern, calculating an amount of deviation of the center position of the measurement beam from the center position of the identifiable pattern, moving the center position of the measurement beam to the center position of the identifiable pattern in response to the calculated amount of shift, measuring a thickness of the thin film layer, and cutting the substrate to obtain a semiconductor chip, wherein the semiconductor chip includes the identifiable pattern.

The method may further comprise a step of forming another semiconductor device with a process that is responsive to the measuring of the thickness of the thin film layer. The method may further comprise a step of mounting the semiconductor device on a circuit board to form an electronic system. The electronic system may comprise an interface serving to transmit data to a communication network. The electronic system may comprise an input/output device.

However, aspects of the present inventive concept are not restricted to the one set forth herein. The above and other aspects of the present inventive concept will become more apparent to one of ordinary skill in the art to which the present inventive concept pertains by referencing the detailed description given below.

Specific matters of other embodiments are included in the detailed description and the drawings.

BRIEF DESCRIPTION OF THE DRAWINGS

The above and other aspects and features of the present inventive concept will become more apparent by describing exemplary embodiments in detail with reference to the attached drawings, in which.

DETAILED DESCRIPTION

Figure 1:
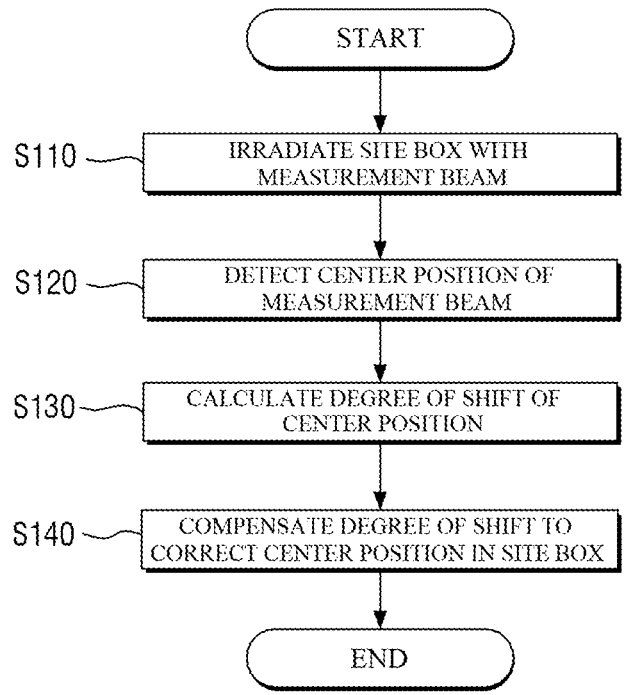
FIG. 1 is a flow chart for explaining a method for measuring a substrate according to some embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the thickness of layers and regions are exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that when an element or layer is referred to as being "connected to," or "coupled to" another element or layer, it can be directly connected to or coupled to another element or layer or intervening elements or layers may be present. In contrast, when an element is referred to as being "directly connected to", "directly coupled to" or "contact" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As used herein, a semiconductor device may refer to any of the various devices such as two transistors, a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device or an electronic system, as used herein, may refer to these semiconductor devices, but may additionally include products that include these devices, such as a memory module, memory card, hard drive including additional components, or a mobile phone, laptop, tablet, desktop, camera, or other consumer electronic device, etc.

In the embodiments of the present inventive concept, a substrate will be described as being a circular wafer as an example. However, the technical idea of the present inventive concept is not limited thereto and is applicable to wafers of various shapes including a square.

Hereinafter, referring to FIGS. 1 to 5, a method for measuring a substrate according to some embodiments of the present inventive concept will be described.

In this embodiment, the method for measuring the substrate will be described as being considered to be a method for measuring the thickness of the substrate. However, this is for description of the inventive concept, and the present inventive concept is not limited thereto. Therefore, aspects of the embodiment of the present inventive concept is applicable to the methods of measuring various properties of the substrate surface using a laser beam.

FIG. 1 is a flow chart for explaining a method for measuring a substrate according to some embodiments of the present inventive concept. FIGS. 2 to 5 are schematic perspective views for explaining a method for measuring a substrate according to the embodiment of FIG. 1.

Referring to FIG. 1, in the method for measuring the substrate according to some embodiments of the present inventive concept, first, a measurement beam is irradiated into a site box (S110). Next, a center position of the measurement beam is detected in the site box (S120), and an amount of shift of the center position of the detected measurement beam from a center position of the site box (or other identifiable patterns) is calculated (S130). Next, the calculated amount of shift is compensated to correct the position of the measurement beam to the center position of the site box (S140). The method may include a step detecting a center position of the site box (or other identifiable patterns) before the calculation of the amount of shift.

The method may include a step of providing the substrate on a stage of a measuring apparatus before the step S110. The method may further include a step forming an identifiable pattern on the substrate and/or a step forming a thin film layer on the identifiable pattern before providing the substrate on the stage.

Figure 2:
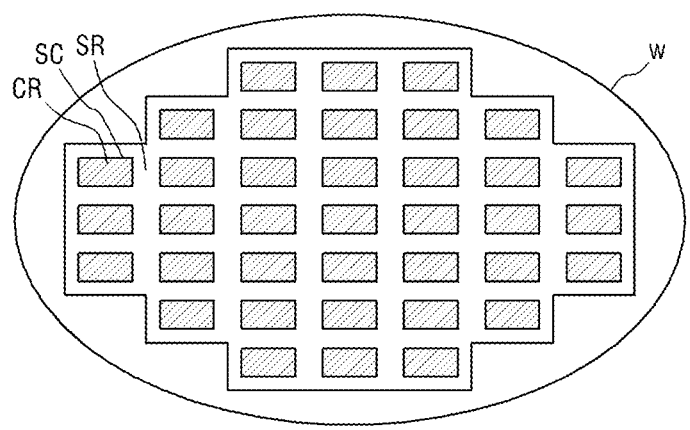
FIGS. 2 to 5 are schematic perspective views for explaining a method for measuring a substrate according to the embodiment of FIG. 1.

Referring to FIG. 2, a substrate W is prepared. The substrate W includes a pattern non-formation region SR and a chip region CR. In the description herein, the chip region CR may define an identifiable pattern from which a site box SC is extracted. However, the invention is not limited hereto. The chip region CR may include multiple patterns formed therein, where a site box SC is extracted from one of these patterns. It thus will be recognized that the description regarding use of the chip region CR as a pattern used to guide a thickness measurement is also applicable to the use of other identifiable patterns other than a chip region CR.

The pattern non-formation region SR may be a region outside the identifiable pattern (e.g., the chip region CR or other pattern). The pattern non-formation region SR may be a scribe line region which may denote a location to later to divide the substrate W into a plurality of separate semiconductor devices as separate semiconductor chips (although it should be emphasized that such a scribe line region does not require separation of the devices from each other so that in certain implementations, the two or more of the semiconductor devices may remain physically connected by a scribe line region in a final product). However, the present inventive concept is not limited thereto, and the pattern non-formation region SR may be a region outside of an identifiable pattern within a semiconductor device (and may include a pattern different from the identifiable pattern). The pattern non-formation region SR may be a region that does not require the thickness measurement of a thin film or a pattern formed on the substrate W. For example, the pattern non-formation region SR may be a region that does not require the measurement of physical or optical properties of the surface of the substrate W. However, it is not limited thereto.

A chip region CR may be a region in which an identifiable pattern is formed, and for example, may be a chip to be singulated from a wafer W. The identifiable pattern need not be limited to a chip region CR and the identifiable pattern may be an OS site (observation site), a pattern formed in an OS site, a cell block region or a pad formed within the chip region CR. The identifiable pattern may comprise a continuous homogeneous material having a surface area formed in a simple geometric shape, such as a rectangle, square, triangle, circle, oval, for example. The identifiable pattern may be a metal conductor, such as Al, Cu, W, Au, and/or Ag. The identifiable pattern may be formed as a dummy structure (e.g., not part of any circuits used by the final semiconductor device) within the chip region CR. The identifiable pattern in some examples may be part of a circuit of the final semiconductor device. For example, the identifiable pattern may comprise a bonding pad for electrical connection with an external wiring (e.g., a chip pad to be connected to a wire bond), a landing pad for electrical connection to an internal conductor (e.g., to provide a connection to a through substrate via (TSV) of the semiconductor device), a material of a cell block (e.g., a metal layer forming a common electrode of a group of capacitors of DRAM memory cells), etc. The identifiable pattern may have a geometric shaped surface area having a size and dimensions of 120 µm×100 µm or less, 120 µm×80 µm or less, 80 µm×60 µm or less, or 55 µm×29 µm or less. A thin film may be deposited over the identifiable pattern. The thin film may be a target of a thickness measurement according the embodiments described herein. In determining the thickness of the thin film, a laser may be used to irradiate the thin film. Part of the laser beam may reflect from the surface of the thin film and another part of the laser beam may reflect from the surface of the identifiable pattern. However, it is not limited thereto. Therefore, the chip region CR may be a region where the thickness measurement of the surface of the substrate W is desired, which may be variously defined depending on various purposes and needs of the chip region CR. For example, the chip region CR of the wafer W may be a region that semiconductor devices are formed and cut into semiconductor chips in a following process. For example, the observation site and/or the cell block region may be formed in the chip region CR. For example, the observation site may have a pad pattern on which various thin films may be formed. The pad pattern may be an identifiable pattern. For example, characteristics of the various thin films formed on the pad pattern may be measured by a measuring apparatus. The characteristics of the various thin films may include thicknesses of the thin films. The cell block region may include a plurality of cell blocks. For example, various thin film may be formed on a cell block. The characteristics including thicknesses of a thin film formed on the cell block may be measured by a measuring apparatus. The cell block may be an identifiable pattern.

Meanwhile, a border of the chip region CR (or other identifiable patterns) may be referred to as a site box SC. For example, the site box may be extracted from the chip region CR. In certain embodiments, the site box SC may an outer contour of an identifiable pattern. The site box SC may surround the identifiable pattern. In certain embodiments, the site box SC may be an outer contour of a cell block or an outer contour of a pad pattern. The site box SC may surround the cell block or a pad pattern.

The chip region CR may be in the form of a rectangle that has a long side in a horizontal direction and a short side in a vertical direction. For example, the chip region may have a rectangular site box SC. For example, an inner region of the site box SC and the site box SC itself may be a chip region CR, and an outer region of the site box SC may be a pattern non-formation region SR. In certain embodiments, the identifiable pattern may have a rectangular site box. For example, the pad pattern and/or the cell block may have a rectangular shape.

Meanwhile, in some embodiments of the present inventive concept, a plurality of the site boxes SC may be provided, and the plurality of the site boxes SC may be disposed and arranged with constant intervals, but the technical idea of the present inventive concept is not limited thereto.

Figure 3A:
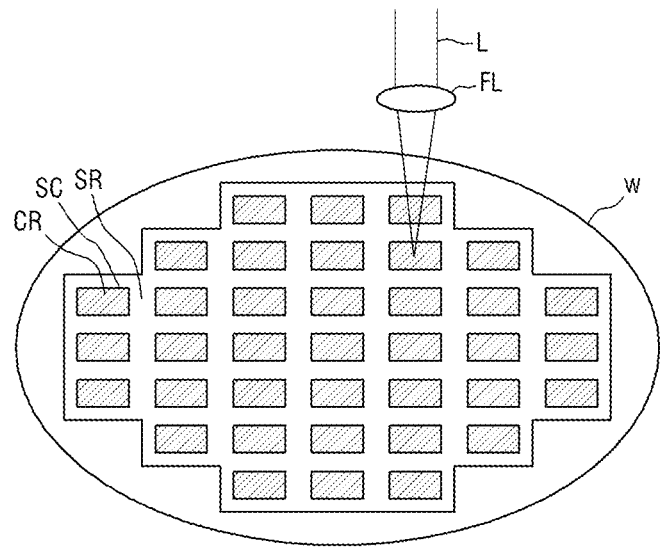
Figure 3B:
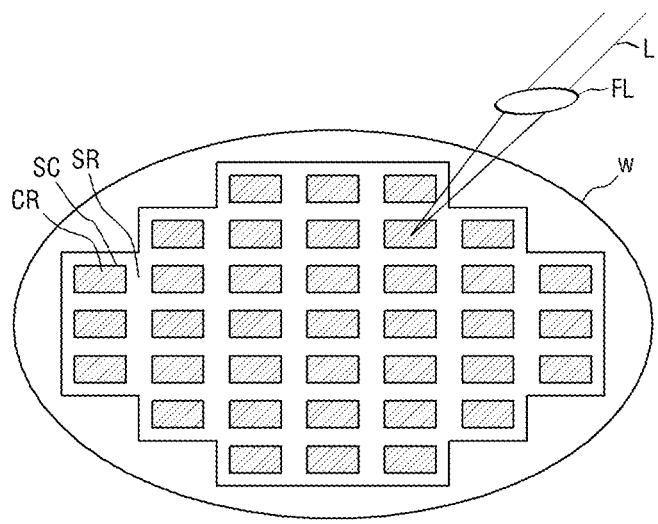

Referring to FIGS. 1 and 3a, a measurement beam L is irradiated into the site box SC that defines the chip region CR or the identifiable pattern of the substrate W (S110).

The site box SC may be defined as the edges of the chip region CR or edges of other identifiable patterns, such as edges of a memory block or edges of a pad. The site box SC may be determined from image analysis of a still image or from one or more frames of a video image of the wafer W. For example, an image of the wafer W may be represented as a two dimensional array of pixels values having an associated light intensity (e.g. brightness value). Rows and columns of the pixel values of this image may be scanned to determine edges of the chip region or edges of other identifiable patterns by detecting locations having a significant change (e.g. a change above a predetermined threshold) in the intensity value from pixel to neighboring pixel, and detecting that a linear pattern (or other expected geometric pattern) in a collection of these locations of light intensity changes represent an edge of the chip region or edges of other identifiable patterns. Edges forming a rectangle of expected size may be determined to be a site box SC representing the edges of the chip region CR or edges of other identifiable patterns. The irradiation may include extraction of the image of the rectangular site box SC, with the image of the chip region CR or other identifiable patterns formed on the substrate W. Determining the location of the site box SC may be performed using other techniques, such as by scanning the wafer with the measurement beam L to detect linear patterns in the deviation of depths of certain layers of the wafer W.

The measurement beam L may be focused on the surface of the substrate W through a focusing lens FL. The center of the measurement beam L may be determined by calculating the center of the periphery of the measurement beam L, where the periphery of the measurement beam L is detected through image analysis, such as described herein with respect to determining the location of the site box, SC. The measurement beam L may be directly irradiated onto the substrate without a focusing lens FL.

Although the measurement beam L is illustrated as being irradiated to the central region of the chip region CR or other identifiable patterns, it is not limited thereto. The measurement beam L may be irradiated at any point on the chip region CR or the identifiable patterns of the site box SC. The location of the measurement beam L may then be adjusted to its target position, which may be the center of the chip region CR or another location within the chip region CR.

Meanwhile, in the present embodiment, although the measurement beam L is illustrated as being focused while forming a point on the chip region CR or other identifiable patterns, it is not limited thereto.

The focusing lens FL may be positioned above the substrate, and the irradiation direction of the measurement beam L may be in a vertical direction of the substrate W, however, other directions of irradiation may be used. For example, referring to FIG. 3b, the irradiation direction of the measurement beam L may form a constant angle with the substrate W.

In this embodiment, the measurement beam L may be a laser beam for measuring the thickness of a pattern formed on the surface of the substrate W. When the measurement beam L is a beam for measuring the thickness, the measurement beam L may be reflected from a top the surface the pattern to be measured and reflected from a bottom surface of the pattern to be measured. As is known, the thickness of the pattern may be determined from analysis of the phase shift of these two reflections of the measurement beam L (with respect to the laser source) or analysis of the interference of these two reflections. Altering the angle of incidence of the measurement beam L may also be performed as part of the thickness measurement. After spectral characteristics (wavelength and intensity) of the incident beam are input to a controller and a predetermined calculation process is performed, the thickness of the pattern at the location of the measurement beam L may be measured. It should be emphasized, that technical idea of the present inventive concept may also be applied to a case where the measurement beam L is not a beam for measuring the thickness of a pattern formed on the surface of the substrate W.

Meanwhile, in this embodiment, the substrate W may be pre-aligned for irradiating the measurement beam L into the chip region CR or other identifiable pattern. For example, when the substrate W is a wafer, in order to visit a specified site in the wafer, a course alignment is performed by a notch finder, and then a fine alignment is performed through an image matching process using a trained image. After this fine alignment, the measurement beam L may be irradiated. However, the technical idea of the present inventive concept is not limited thereto.

Figure 4:
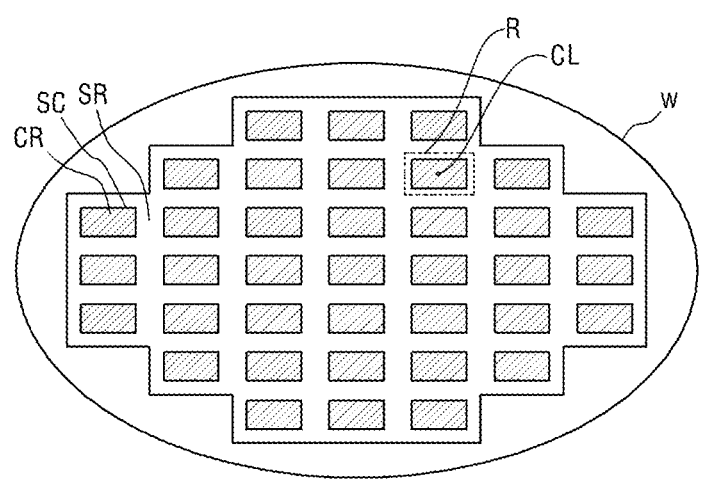

Referring to FIGS. 1 and 4, the center position CL of the measurement beam L irradiated into the site box SC is detected. The site box SC may be defined by the edges of the chip region CR or other identifiable patterns in the substrate W and detected as described herein.

The center position CL of the measurement beam L means the center position of the measurement beam L (as distinguished from the center position of the chip region CR or other identifiable patterns).

Accordingly, in this embodiment, although the center position CL of the measurement beam L is illustrated as being formed in the central region of the chip region CR or other identifiable patterns, it is not limited thereto. The center position CL may be formed on various regions in the chip region CR or other identifiable patterns of the site box SC.

Figure 5:
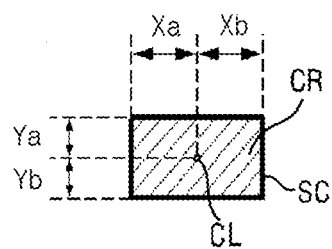

Referring to FIGS. 1 and 5, the amount of shift of the center position CL of the measurement beam L in the site box SC is calculated (S130).

The chip region CR illustrated in the embodiment of FIG. 5 may be a chip region CR within a region defined by a dotted line R of FIG. 4, but it is not limited thereto. For example, the chip region CR illustrated in the embodiment of FIG. 5 may be any one of the plurality of chip regions CR disposed on the substrate W. It will be understood that the descriptions with reference to a chip region CR herein may also be applied to other identifiable patterns, such as a single conductive pad and a cell block.

In this embodiment, the amount of shift of the center position CL of the measurement beam L within the site box SC may be calculated with reference to the center of the extracted site box SC image.

In the embodiments of the disclosure, a shift may mean a state in which the center position CL of the measurement beam L is not at the center position of the chip region CR or centers of the other identifiable patterns. For example, the amount of shift may mean a degree in which the center position CL deviates from center position of the chip region CR or the centers of the other identifiable patterns.

For example, referring to FIG. 5 again, a rectangular site box SC has a long side and a short side, the length of the long side may be represented by the sum of Xa and Xb with reference to the center position CL of the measurement beam L. Xa is the distance between the center position CL and one end of the rectangular site box SC in the longer direction. Xb is the distance between the center position CL and the other end of the rectangular site box SC in the longer direction. The length of the short side may be represented by the sum of Ya and Yb with reference to the center position CL of the measurement beam L. Ya is the distance between the center position CL and one end of the rectangular site box SC in the shorter direction. Yb is the distance between the center position CL and the other end of the rectangular site box SC in the shorter direction.

In this embodiment, a state of not being shifted may be defined as a state in which the values of Xa and Xb are the same, and the values of Ya and Yb are the same.

In contrast, the following cases may be defined that the center position CL of the measurement beam is shifted: a case where the values of Xa and Xb are the same but the values of Ya and Yb are different from each other; a case where the values of Xa and Xb are different from each other but the values of Ya and Yb are the same; and a case where the values of Xa and Xb are different from each other and the values of Ya and Yb are different from each other.

The amount of shift (ABSshift) may be measured by Formula (1) below.

Formula (1)

$$X\ shift = (Xa - Xb)/2 \quad (a)$$

$$Y\ shift = (Ya - Yb)/2 \quad (b)$$

$$ABSshift = root\ (X\ shift^2 + Y\ shift^2) \quad (c)$$

In Formula (1), X shift represents the amount of shift in the longer direction of the site boxes SC, and Y shift represents the amount of shift in the shorter direction of the site box SC. The amount of shift (ABSshift) may be calculated by the square root of the sum of the square of (a) of Formula (1) and the square of (b) of Formula (1). For example, the amount of shift (ABSshift) of the center position CL may be calculated, using the two-dimensional coordinates of the center position CL in the site box SC.

Meanwhile, in this embodiment, although an amount of shift (ABSshift) in a single site box SC is described, the inventive concept is not limited thereto.

For example, it is possible to calculate each of the amounts of the shift (ABSshift) in the plurality of the site boxes SC disposed in the different regions of the substrate W.

Next, referring to FIG. 1 again, a process of compensating (S140) the calculated amount of shift (ABSshift) to correct the center position CL of the measurement beam L to the center of the site boxes SC is performed.

For example, when the substrate W is disposed on a wafer stage, the wafer stage is moved in consideration of the calculated amount of shift (ABSshift) to move the center position CL of the measurement beam L with respect to the site box SC and the chip region CR or other identifiable patterns. Thus, the center position CL of the measurement beam L in the site box SC may be moved to the center of the site box SC. However, it is not limited thereto. For example, the center position CL of the measurement beam L in the site box SC may be adjusted through the movement the incident measurement beam L, such as by movement of a light source for irradiating the measurement beam L rather than moving the substrate W. Also, the center position CL of the measurement beam L in the site box SC may be corrected by moving both of the substrate W and the light source for irradiating the measurement beam L.

By compensating the amount of the calculated shift (ABSshift) to correct the center position CL in the site box SC, the center position may be disposed in the central region of the chip region CR or the identifiable patterns of the measuring position. In various measurements of the chip region CR or the identifiable patterns, it is beneficial to measure the characteristics of the central region. For example, measuring the thickness of a layer on the chip region CR or identifiable patterns at the central region of the chip region CR or identifiable patterns may be beneficial compared to measuring the thickness of this layer at an edge portion of a chip region. For example, measuring the thickness of a layer in a central portion of a chip or identifiable patterns may produce more accurate data than measuring the thickness of a layer in an edge portion of a chip or identifiable patterns. As semiconductor devices are miniaturized, measuring the thickness of a pattern of the central region of the chip region CR or the identifiable patterns may get a better result than measuring a thickness of a pattern of an edge region of the chip region CR or the identifiable patterns.

After obtaining the measurement of the thickness of the layer at the center of the chip region CR or center of the other identifiable pattern, the semiconductor device fabrication may be completed using this measurement. For example, further layers may be deposited and patterned on the measured semiconductor device to form or finalize a circuit of the semiconductor device, and the semiconductor device may be singulated from the wafer and packaged in a semiconductor package to allow the package and semiconductor device to be connected to a printed circuit board as part of an electronic system. The measurement of the thickness may be used to adjust process conditions/parameters of such deposition and patterning. The measurement of the thickness of the layer may also be used to adjust process conditions/parameters to complete one or more semiconductor devices (e.g., having the same circuitry) that are subsequently made. For example, in sequentially manufacturing a batch of wafers W, every $100^{th}$ or wafer may have a thickness measurement performed, such thickness measurement being used to adjust process conditions/parameters for subsequently manufactured wafers and the semiconductor devices formed thereon.

Meanwhile, although the description has given of a case where the calculated amount of shift (ABSshift) is set to zero by compensation of the calculated amount of shift (ABSshift) as an example, the present inventive concept is not limited thereto. For example, the amount of shift (ABSshift) of the center of the measurement beam L and the center of the chip region CR or center of the other identifiable pattern may be allowed to deviate within a predetermined threshold (e.g., by 10 µm or less, or by 5 µm or less).

For example, as long as it is possible to improve the accuracy of measurement through the measurement of the thickness of a region other than the central region depending on the type of the chip region CR or the identifiable patterns and the type of the pattern in the chip region CR or the identifiable patterns, the above-mentioned compensation of the calculated amount of shift (ABSshift) may mean movement of the center position of the measurement beam L to that region CL.

Therefore, the present inventive concept is not limited to the simple movement of the center position CL of the measurement beam L to the center position in the site box SC.

Next, a method for measuring the substrate according to some embodiments of the present inventive concept will be described referring to FIGS. 6 and 7.

Figure 6:
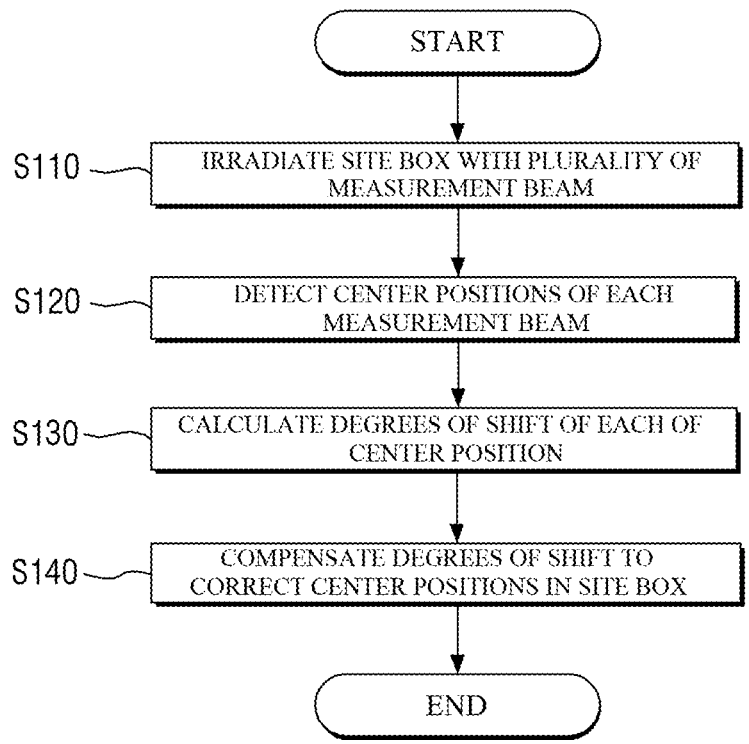
FIG. 6 is a flow chart for explaining a method for measuring a substrate according to some embodiments of the present inventive concept.

FIG. 6 is a flow chart for explaining a method for measuring a substrate according to some embodiments of the present inventive concept. FIG. 7 is a schematic perspective view for explaining a method for measuring the substrate according to the embodiment of FIG. 6.

Figure 7:
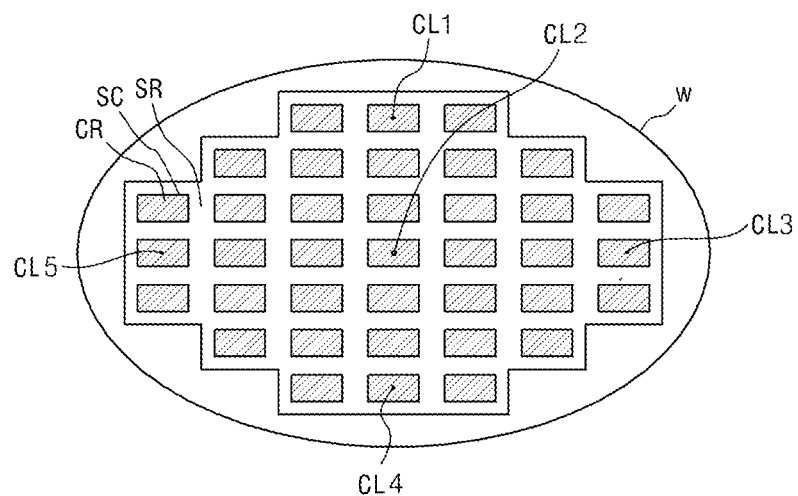
FIG. 7 is a schematic perspective view for explaining a method for measuring the substrate according to the embodiment of FIG. 6.

The embodiments according to FIGS. 6 and 7 are substantially the same as the embodiments described above with reference to FIGS. 1 through 5 except for the number of center positions CL of the measurement beam L. Therefore, the same reference numerals refer to the same constituent elements, and thus, the repeated description of the same constituent elements may be omitted.

The method for measuring the substrate according to the present embodiment irradiates the site box with a plurality of measurement beams (S110). Next, the respective center positions of the plurality of measurement beams in the site box are detected (S120), and the amounts of shift of each center position of the detected measurement beam are calculated (S130). Next, the calculated amount of shift is compensated to correct (S140) the center position in the site box.

In this embodiment, the step S110 is substantially the same as the step S110 of FIG. 1 except for irradiating the plurality of measurement beams. The step S120 is substantially the same as the step S120 of FIG. 1 except for detecting each center position of the plurality of measurement beams. The step S130 is substantially the same as the step S130 of FIG. 1 except for calculating the amounts of shift of each of the plurality of center positions.

For example, referring to FIGS. 6 and 7, a plurality of measurement beams is irradiated onto the surface of the substrate W, and a plurality of center positions CL1, CL2, CL3, CL4 and CL5 is formed.

The plurality of center positions may include a first center position CL1, a second center position CL2, a third center position CL3, a fourth center position CL4 and a fifth center position CL5.

For example, the first center position CL1 may be disposed at an upper edge of the substrate W surface, the second center position CL2 may be disposed in the central region of the substrate W, the third center position CL3 may be disposed at a right edge of the substrate W, the fourth center position CL4 may be disposed at a lower edge of the substrate W, and the fifth center position CL5 may be disposed at a left edge of the substrate W.

In this embodiment, five center positions CL1 through CL5 are formed in the substrate W, but the present inventive concept is not limited thereto.

In this embodiment, center positions CL1, CL3, CL4 and CL5 may be formed in chip regions CR disposed at edges of the substrate W, and the second center position CL2 may be formed in a chip region CR disposed in the central region of the substrate W. When correcting the measuring position at the edges of the substrate W, it may more effectively improve the measurement accuracy.

Accordingly, in this embodiment, although the measurement of the second center position CL2 of the central region of the substrate W is illustrated, it is not limited thereto.

Next, the method for measuring the substrate according to some embodiments of the present inventive concept will be described referring to FIG. 8.

Figure 8:
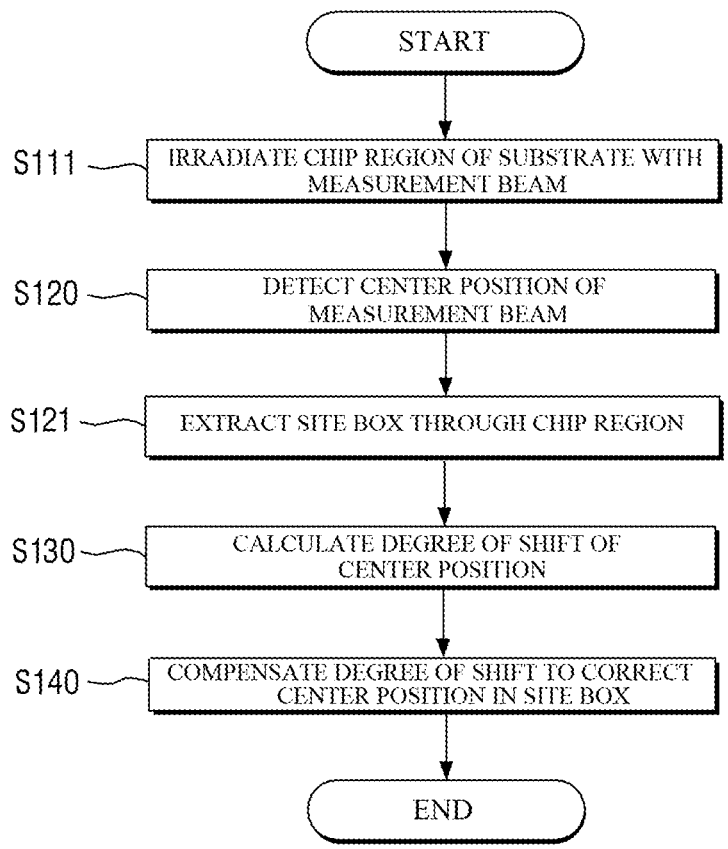
FIG. 8 is a flow chart for explaining a method for measuring a substrate according to some embodiments of the present inventive concept.

FIG. 8 is a flow chart for explaining the method for measuring the substrate according to some embodiments of the present inventive concept.

The method for measuring the substrate according to the embodiment of FIG. 8 is substantially the same as the embodiment described above with reference to FIG. 1 except that the measurement beams is first irradiated into the chip region of the substrate, and then the site boxes are extracted from the chip region after detecting the center position CL of the measurement beam L. Therefore, the same reference numerals refer to the same constituent elements, and thus, the repeated description of the same elements may be omitted.

Referring to FIG. 8, in the method for measuring the substrate according to some embodiments of the present inventive concept, first, the measurement beam is irradiated into the chip region of the substrate (S111). Next, the center position of the measurement beam is detected in the chip region (S120), and a site box is extracted from the chip region (S121). Next, the amount of shift of the center position in the site box is calculated (S130). Then, the calculated amount of shift is compensated to correct the center position in the site box (S140).

In this example, after irradiating the measurement beam into the chip region of the substrate, the center position of the measurement beam and the site box are extracted. Here, the site box may be an image defined by the chip region as described in the aforementioned embodiment.

Next, a substrate measurement system that performs the method for measuring the substrate according to some embodiments of the present inventive concept will be described referring to FIG. 9.

Figure 9:
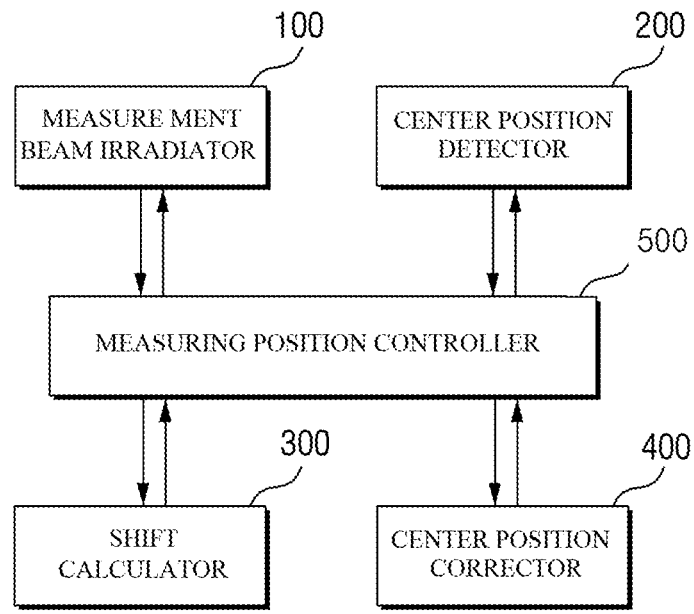
FIG. 9 is a block diagram of a substrate measurement system that performs a method for measuring a substrate according to some embodiments of the present inventive concept.

FIG. 9 is a block diagram of a substrate measurement system that performs the method for measuring the substrate according to some embodiments of the present inventive concept.

The substrate measurement system according to this embodiment may perform the method for measuring the substrate described above with reference to FIGS. 1 and 6. The substrate measurement system according to this embodiment includes a measurement beam irradiator 100, a center position detector 200, a shift calculator 300, a center position corrector 400 and a measuring position controller 500.

In this embodiment, although the measurement beam irradiator 100, the center position detector 200, the shift calculator 300 and the center position corrector 400 are illustrated to be controlled through a single measuring position controller 500, it is not limited thereto. Thus, each of the measurement beam irradiator 100, the center position detector 200, the shift calculator 300 and the center position corrector 400 may also include an individual controller.

Meanwhile, in this embodiment, although each of the measurement beam irradiator 100, the center position detector 200, the shift calculator 300 and the center position corrector 400 is illustrated to transmit and receive electric signals with the measuring position controller 500, it is not limited thereto. Thus, each of the measurement beam irradiator 100, the center position detector 200, the shift calculator 300 and the center position corrector 400 may mutually transmit and receive electrical signals.

Referring to FIG. 9, a step of irradiating (S110) the measurement beam into the site box of FIGS. 1 and 6 may be performed in the measurement beam irradiator 100. For example, the measurement beam irradiator 100 may include a light source for irradiating the measurement beam, and a sensor for measuring the pattern thickness of the substrate W by using the measurement beam.

A step of detecting (S120) the center position of the measurement beam in the site box of FIGS. 1 and 6 may be performed in the center position detection unit 200. For example, the center position detector 200 may detect a region in which the measurement beam is reflected from the substrate, and may detect the center position of the measurement beam in that region.

A step of calculating (S130) the amount of shift of the center position of the detected measurement beam of FIGS. 1 and 6 may be performed in the shift calculator 300. For example, after extracting the center positions of the site box and the measurement beam, by performing image matching between the center positions and the image of the chip region CR of the substrate W, the amount of shift may be calculated.

For example, first, the center position of the measurement beam is detected in the center position detector 200, and the site box that surrounds along the edge of the chip region CR of the substrate W is detected. Next, by performing the image matching of the center position of the detected measurement beam and the site box with the image of the chip region CR of the substrate W, the amount of shift is calculated with the method described through FIG. 5.

Next, a step of correcting (S140) the center position in the site box by compensating the calculated amount of shift of FIGS. 1 and 6 may be performed in the center position corrector 400.

Meanwhile, the measuring position controller 500 may perform the control so that each of the measurement beam irradiator 100, the center position detector 200, the shift calculator 300 and the center position corrector 400 can perform the steps separately or together. Therefore, the measuring position controller 500 may perform assistance or control so that each of the measurement beam irradiator 100, the center position detector 200, the shift calculator 300 and the center position corrector 400 performs their own steps FIG. 10 is a block diagram of an electronic system including a semiconductor device manufactured by using the method for measuring the substrate according to some embodiments of the present inventive concept.

Figure 10:
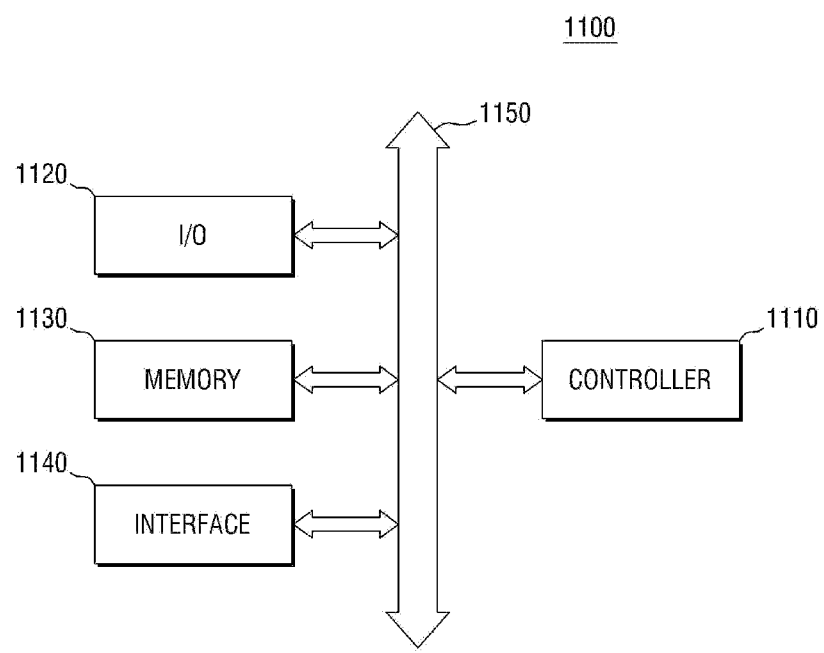
FIG. 10 is a block diagram of an electronic system including a semiconductor device formed by using a method for measuring a substrate according to some embodiments of the present inventive concept.

Referring to FIG. 10, an electronic system 1100 according to the embodiment of the present inventive concept may include a controller 1110, an input/output (I/O) device 1120, a memory device 1130, an interface 1140 and a bus 1150.

The controller 1110, the I/O device 1120, the memory device 1130 and/or the interface 1140 may be connected to one another through a bus 1150. The bus 1150 corresponds to a path through which the data are transferred.

The controller 1110 may include at least one of a microprocessor, a digital signal processor, a microcontroller and logic elements capable of performing similar functions.

The I/O device 1120 may include a keypad, a keyboard, a display device and the like. The memory device 1130 may store data and/or commands.

The interface 1140 may serve to transmit data or receive data to or from a communication network. The interface 1140 may be a wired or wireless interface. For example, the interface 1140 may include an antenna or a wired or wireless transceiver. Further, the electronic system 1100 may further include a high-speed DRAM and/or SRAM as an operation memory to improve the operation of the controller 1110.

The semiconductor device manufactured according to the embodiments of the present inventive concept may be provided in the memory device 1130 or may be provided as part of the controller 1110, the I/O device 1120 and the like.

The electronic system 1100 may be applied to a personal digital assistant (PDA), a portable computer, a web tablet, a wireless phone, a mobile phone, a digital music player, a memory card or all types of electronic products capable of transmitting or receiving information in a wireless environment.

While the present inventive concept has been particularly illustrated and described with reference to exemplary embodiments thereof, it will be understood by those of ordinary skill in the art that various changes in form and detail may be made therein without departing from the idea and scope of the present inventive concept as defined by the following claims. The exemplary embodiments should be considered in a descriptive sense only and not for purposes of limitation.

What is claimed is:

1. A method of manufacturing a semiconductor device, comprising:
   providing a substrate on a stage of a measuring apparatus;
   irradiating a measurement beam into an identifiable pattern of the substrate;
   detecting a center position of the irradiated measurement beam;
   detecting a center position of the identifiable pattern;
   calculating an amount of shift of the center position of the measurement beam from the center position of the identifiable pattern; and
   moving the center position of the measurement beam to the center position of the identifiable pattern in response to the calculated amount of shift.

2. The method for claim 1, wherein the identifiable pattern is a conductive pad of the semiconductor device.

3. The method for claim 1, wherein the identifiable pattern is a metal layer of a memory cell block of the semiconductor device.

4. The method for claim 1, wherein the calculation of the amount of shift of the center position of the measurement beam comprises using two-dimensional coordinates of the center position of the measurement beam in the identifiable pattern.

5. The method for claim 1, further comprising:
measuring a thickness of a layer formed on the identifiable pattern using the measurement beam, after the moving the center position of the measurement beam to the center position of the identifiable pattern.

6. The method for claim 1, wherein the moving the center position of the measurement beam to the center position of the identifiable pattern comprises moving the substrate.

7. The method for claim 6, wherein the moving the center position of the measurement beam to the center position of the identifiable pattern comprises moving the substrate so that the amount of shift of the center position becomes zero.

8. The method for claim 1, wherein the moving the center position of the measurement beam comprises detecting a plurality of center positions.

9. The method for claim 8, wherein at least one of the plurality of center positions is adjacent to an edge of the substrate.

10. A method of manufacturing a semiconductor device, the method comprising:
irradiating a measurement beam into a chip region of a substrate;
detecting a center position of the measurement beam after irradiating the measurement beam;
extracting a site box representing edges of an identifiable pattern of the semiconductor device from the chip region irradiated with the measurement beam;
calculating an amount of shift of the center position of the measurement beam from a center position of the site box; and
adjusting the center position of the measurement beam to correspond to the center position of the site box in response to the calculated amount of shift.

11. The method for claim 10, wherein the site box is determined from an image extracted from the identifiable pattern in the chip region.

12. The method for claim 11, wherein the identifiable pattern comprises a patterned metal having a rectangular surface area.

13. The method for claim 11, wherein the calculating the amount of shift of the center position of the measurement beam from the center position of the site box comprises using two-dimensional coordinates of the center position of the measurement beam in the site box.

14. The method for claim 11, further comprising:
measuring a thickness of a layer formed on the identifiable pattern in the chip region using the measurement beam, after the adjusting the center position of the measurement beam to the center position of the site box.

15. The method for claim 10, wherein the adjusting the center position of the measurement beam to the center position of the site box comprises moving the substrate.

16. A method of manufacturing a semiconductor device, comprising:
forming an identifiable pattern with a thin film layer on a substrate;
providing the substrate on a stage of a measuring apparatus;
irradiating a measurement beam on the identifiable pattern of the substrate;
detecting a center position of the irradiated measurement beam;
detecting a center position of the identifiable pattern;
calculating an amount of deviation of the center position of the measurement beam from the center position of the identifiable pattern;
moving the center position of the measurement beam to the center position of the identifiable pattern in response to the calculated amount of shift;
measuring a thickness of the thin film layer; and
cutting the substrate to obtain a semiconductor chip, wherein the semiconductor chip includes the identifiable pattern.

17. The method of claim 16, further comprising:
forming another semiconductor device with a process that is responsive to the measuring of the thickness of the thin film layer.

18. The method of claim 16, further comprising:
mounting the semiconductor device on a circuit board to form an electronic system.

19. The method of claim 18, wherein the electronic system comprises an interface serving to transmit data to a communication network.

20. The method of claim 18, wherein the electronic system comprises an input/output device.

* * * * *